United States Patent
Nakabayashi

(10) Patent No.: US 10,672,963 B2
(45) Date of Patent: Jun. 2, 2020

(54) METHOD OF MANUFACTURING SUBSTRATE AND METHOD OF MANUFACTURING LIGHT EMITTING DEVICE

(71) Applicant: NICHIA CORPORATION, Anan-shi, Tokushima (JP)

(72) Inventor: Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/116,494

(22) Filed: Aug. 29, 2018

(65) Prior Publication Data

US 2019/0067542 A1 Feb. 28, 2019

(30) Foreign Application Priority Data

Aug. 31, 2017 (JP) .................................. 2017-167379

(51) Int. Cl.
  *H05K 3/30* (2006.01)
  *H05K 3/40* (2006.01)
  *G02B 6/42* (2006.01)
  *G02B 6/122* (2006.01)
  *H01L 33/62* (2010.01)
  (Continued)

(52) U.S. Cl.
  CPC ............ *H01L 33/62* (2013.01); *H01L 33/486* (2013.01); *H01L 33/507* (2013.01); *H01L 33/54* (2013.01); *H01L 33/60* (2013.01); *H01L 2933/005* (2013.01); *H01L 2933/0033* (2013.01);
  (Continued)

(58) Field of Classification Search
  CPC ............... H01L 33/505; H01L 33/46; H01L 2933/0041; H01L 33/508; H01L 33/54
  See application file for complete search history.

(56) References Cited

U.S. PATENT DOCUMENTS

2006/0223200 A1* 10/2006 Maruyama ............. B82Y 10/00
  438/7
2012/0193662 A1*  8/2012 Donofrio ................ H01L 33/60
  257/98
(Continued)

FOREIGN PATENT DOCUMENTS

JP  H05261971 A  10/1993
JP  2002111148 A  4/2002
(Continued)

*Primary Examiner* — Brian Turner
(74) *Attorney, Agent, or Firm* — Hunton Andrews Kurth LLP

(57) ABSTRACT

A method of manufacturing a substrate for a light emitting device includes: forming wiring to form a plurality of first wiring parts and second wiring parts on/above an upper surface of a base member; forming projection parts including a first projection part on each of the first wiring parts and a second projection part on each of the second wiring parts by forming a first metal film on a region including at least parts of the first wiring parts and the second wiring parts and etching the first metal film using a resist for forming projection part; and forming an alignment mark by forming a second metal film on the substrate and etching the second metal film using a resist, wherein the resist for forming the projection part and the resist for forming alignment mark are exposed to light in an identical step of exposing to light.

14 Claims, 9 Drawing Sheets

(51) Int. Cl.
  *H01L 33/48* (2010.01)
  *H01L 33/50* (2010.01)
  *H01L 33/60* (2010.01)
  *H01L 33/54* (2010.01)

(52) U.S. Cl.
  CPC ............. *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2014/0291611 A1* | 10/2014 | Tseng | H01L 33/505 257/13 |
| 2014/0347835 A1* | 11/2014 | Shimizu | H05K 1/0269 361/764 |
| 2015/0001563 A1 | 1/2015 | Miki | |
| 2015/0028372 A1 | 1/2015 | Nakanishi et al. | |
| 2015/0287684 A1* | 10/2015 | Ishiguro | H01L 23/585 257/774 |
| 2016/0005685 A1 | 1/2016 | Rokugawa | |
| 2016/0155914 A1 | 6/2016 | Miki | |
| 2016/0247976 A1* | 8/2016 | Rudmann | H01L 31/0203 |
| 2016/0274317 A1 | 9/2016 | Tsujita et al. | |
| 2017/0110635 A1 | 4/2017 | Ito | |
| 2018/0182938 A1 | 6/2018 | Miki | |
| 2018/0182939 A1* | 6/2018 | Liu | H01L 33/58 |

FOREIGN PATENT DOCUMENTS

| | | |
|---|---|---|
| JP | 2006156856 A | 6/2006 |
| JP | 2006237088 A | 9/2006 |
| JP | 2010192606 A | 9/2010 |
| JP | 2012142459 A | 7/2012 |
| JP | 2013093393 A | 5/2013 |
| JP | 2014011403 A | 1/2014 |
| JP | 2015026746 A | 2/2015 |
| JP | 2015053326 A | 3/2015 |
| JP | 2015087475 A | 5/2015 |
| JP | 2015119096 A | 6/2015 |
| JP | 2016018806 A | 2/2016 |
| JP | 2017076719 A | 4/2017 |
| WO | 2015064355 A1 | 5/2015 |

* cited by examiner

METHOD OF MANUFACTURING SUBSTRATE AND METHOD OF MANUFACTURING LIGHT EMITTING DEVICE

CROSS-REFERENCE TO RELATED APPLICATION

This application claims priority to Japanese Patent Application No. 2017-167379, filed on Aug. 31, 2017, the disclosure of which is hereby incorporated by reference in its entirety.

BACKGROUND

The present disclosure relates to a method of manufacturing a substrate for a light emitting device.

In recent years, light emitting devices including light emitting elements such as light emitting diodes are used in various applications, and their inexpensive availability is desired. In order to meet the needs, for example, Japanese Unexamined Patent Publication No. 2017-076719 discloses a method of manufacturing a light emitting device including a substrate, and a light emitting element and a resin sheet on the substrate. Specifically, what is disclosed is a method of manufacturing a light emitting device including: providing a resin sheet that comprises a lattice-patterned reflective material-containing portion and film-shaped phosphor-containing portions covering lattice openings of the reflective material-containing portion; placing the resin sheet on a substrate mounting a plurality of light-emitting elements such that each of the plurality of light-emitting elements is surrounded by the reflective material-containing portion and is covered on the top with the phosphor-containing portion; after placing the resin sheet on the substrate, softening the resin sheet by heating such that the phosphor-containing portions are adhered to the respective upper surfaces of the plurality of light-emitting elements and the reflective material-containing portion or the phosphor-containing portions is/are adhered to the side surfaces of the plurality of light-emitting elements; and curing the resin sheet and the substrate to obtain individual light emitting devices.

However, light emitting devices being more inexpensive and smaller in size and weight are now in increasing demand. There are some cases where light emitting devices are manufactured by: arranging a plurality of light emitting elements on a substrate; and after performing predetermined steps, cutting the substrate. In such cases, the light emitting elements must be precisely mounted at their respective predetermined positions, and the substrate must be precisely cut at each predetermined position. For example, with the light emitting device disclosed in the patent publication No. 2017-076719 in which the surroundings of the light emitting element and the fluorescent material containing part are covered with the reflective member containing part, the reflective member containing part may be minimized in thickness to achieve downsizing. On the other hand, with greater variance in the cutting positions relative to the mounting positions of the light emitting elements and the resin sheet, the reflective member containing part must be great in thickness taking into consideration of the amount of variance and, hence, downsizing is limited. Further, greater variance in the cutting positions relative to the mounting positions of the light emitting elements and the resin sheet result in poor yields. That is, cost efficiency cannot be achieved.

SUMMARY

Accordingly, an object of certain embodiment of the present disclosure is to provide a method of manufacturing a substrate with which the cutting positions are highly precisely adjustable relative to the mounting positions of reference light emitting elements.

Further, other object of certain embodiment of the present disclosure is to provide a method of manufacturing a light emitting device being cost-efficient and small in size.

A method of manufacturing a substrate according to certain embodiment of the present disclosure is a method of manufacturing a substrate for a light emitting device, the method including: forming wiring to form a plurality of first wiring parts and a plurality of second wiring parts on an upper surface of a base member; forming projection parts including a first projection part on each of the first wiring parts and a second projection part on each of the second wiring parts by forming a first metal film on a region including at least part of the first wiring parts and at least part of the second wiring parts and etching the first metal film using a resist having a predetermined shape for forming the projection parts; and forming at least one alignment mark by forming a second metal film on the substrate and etching the second metal film using a resist for forming the at least one alignment mark, wherein the resist for forming the projection parts and the resist for forming the at least one alignment mark are exposed to light in an identical step of exposing to light.

Further, a method of manufacturing a light emitting device according to certain embodiment of the present disclosure includes: the method of manufacturing a substrate; mounting light emitting elements to bond at least one light emitting element each including a p-side electrode and an n-side electrode on an identical surface side in each of the unit mounting regions, wherein the p-side electrode is bonded to an upper surface of corresponding one of the first projection parts, and the n-side electrode is bonded to an upper surface of corresponding one of the second projection parts.

The above-described methods of manufacturing substrates according to certain embodiment of the present disclosure provides a substrate with which the cutting positions are highly accurately adjustable relative to the mounting positions of the reference light emitting elements.

Further, the above-described methods of manufacturing a light emitting device according to the embodiment of the present disclosure can provide a light emitting device having advantages of cost-efficient and small in size.

DETAILED DESCRIPTION OF EMBODIMENT

In the following, a description will be given of an embodiment of the present disclosure with reference to the drawings.

First Embodiment

A first embodiment relates to a substrate 10 for a light emitting device in which unit mounting regions each including a wiring to be connected to a light emitting element, and a method of manufacturing the substrate 10.

Substrate for Light Emitting Device According to First Embodiment

Figure 1:
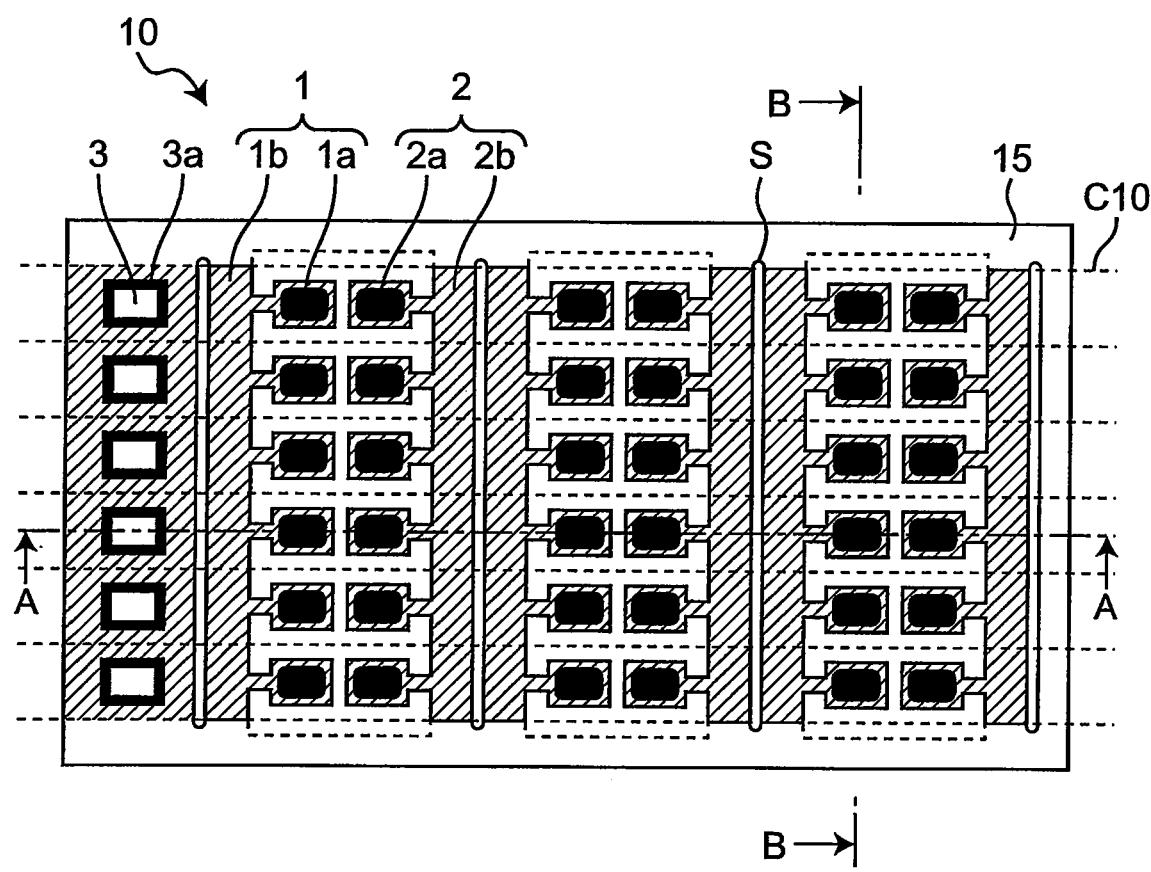
FIG. 1 is a plan view of a substrate for a light emitting device according to a first embodiment of the present disclosure.

The substrate 10 for a light emitting device according to the first embodiment includes a base member 15 on whose one main surface a plurality of unit mounting regions is collectively provided. Each unit mounting region includes at least one first wiring part and at least one second wiring part. In the example shown in FIG. 1, each unit mounting region includes a pair of first wiring 1 and second wiring 2 provided to facing each other on one main surface. A light emitting element is mounted for each unit mounting region. The unit mounting regions are arranged in a matrix of 6 rows×3 columns. Alignment marks 3 are provided along one side of the base member 15 so as to correspond to respective rows in which the unit mounting regions are arranged in the lateral direction in a top view. The alignment marks 3 may be, for example, each an opening formed by removing a metal film formed on the surface of the base member in a predetermined shape such as an angular shape, rectangular shape, a circular shape, an oval shape or the like, whereby the surface of the base member 15 is exposed. In the substrate 10 according to the first embodiment, the metal film around the alignment marks 3 where the surface of the base member 15 is exposed has a thickness in Z direction increased to form metal frames 3a around the alignment marks 3, so that the alignment marks 3 are easily recognized.

In the following description, the columns in each of which the unit mounting regions are arranged in the vertical direction in a top view are referred to as the first column, the second column, and the third column, from the side close to the alignment marks 3.

The unit mounting regions may be arranged so as to form one row or one column. The unit mounting regions are preferably arranged in a matrix of a plurality of rows and columns. Further, in the present disclosure, one of the column direction and the row direction may be referred to as one direction.

Further, in each unit mounting region, the first wiring 1 includes a first wiring part 1b and a first projection part 1a formed on the first wiring part 1b, and the second wiring 2 includes a second wiring part 2b and a second projection part 2a formed on the second wiring part 2b. The first projection part 1a and the second projection part 2a are provided so as to respectively face a p-side electrode 31 and an n-side electrode 32 of a light emitting element when the light emitting element is mounted. As described above, by providing the first projection part 1a and the second projection part 2a respectively on the first wiring part 1b and the second wiring part 2b, in mounting a light emitting element, the light emitting element can be mounted with high positional accuracy relative to the first projection part 1a and the second projection part 2a using the self-alignment effect based on the first projection part 1a and the second projection part 2a.

In the substrate 10 according to the first embodiment, through slits S are respectively provided to penetrate through the base member 15, between the column in which the alignment marks 3 are arranged and the first column of the unit mounting regions, between the first column and the second column, between the second column and the third column, and on the outer side of the third column. Here, each first wiring part 1b and each second wiring part 2b extend along the lateral surface of each through slit S and part of the other main surface (i.e., the lower surface) of the base member 15, and these first wiring part 1b and second wiring part 2b at part of the other main surface configure external connection electrodes of the light emitting device. Further, in FIG. 1, the broken lines represent cutting lines C10 along which the substrate 10 is cut after a plurality of light emitting devices each including a light emitting element is collectively fabricated on the substrate 10. As can be understood from the foregoing, in the substrate 10, each unit mounting region is defined by a region surrounded by the through slits S and the cutting lines C10.

In the substrate 10 for a light emitting device according to the first embodiment, each alignment mark 3 is formed with high positional accuracy relative to the first projection part 1a and the second projection part 2a particularly by being fabricated through the manufacturing method described below. In this manner, after a plurality of light emitting devices is collectively fabricated on the substrate 10, the substrate can be cut by setting it at the cutting position with reference to each alignment mark 3 formed with high positional accuracy relative to the first projection part 1a and the second projection part 2a. Thus, the substrate can be cut with the cutting position set precisely relative to each mounted light emitting element. Accordingly, when a light emitting device including a light emitting element is manufactured using the substrate 10 for a light emitting device according to the first embodiment, the interval between the lateral surface of the light emitting element and the cutting position can reliably be obtained with high accuracy and can be set to a minimum required distance. Hence, downsizing of the light emitting device is achieved.

Figure 2:
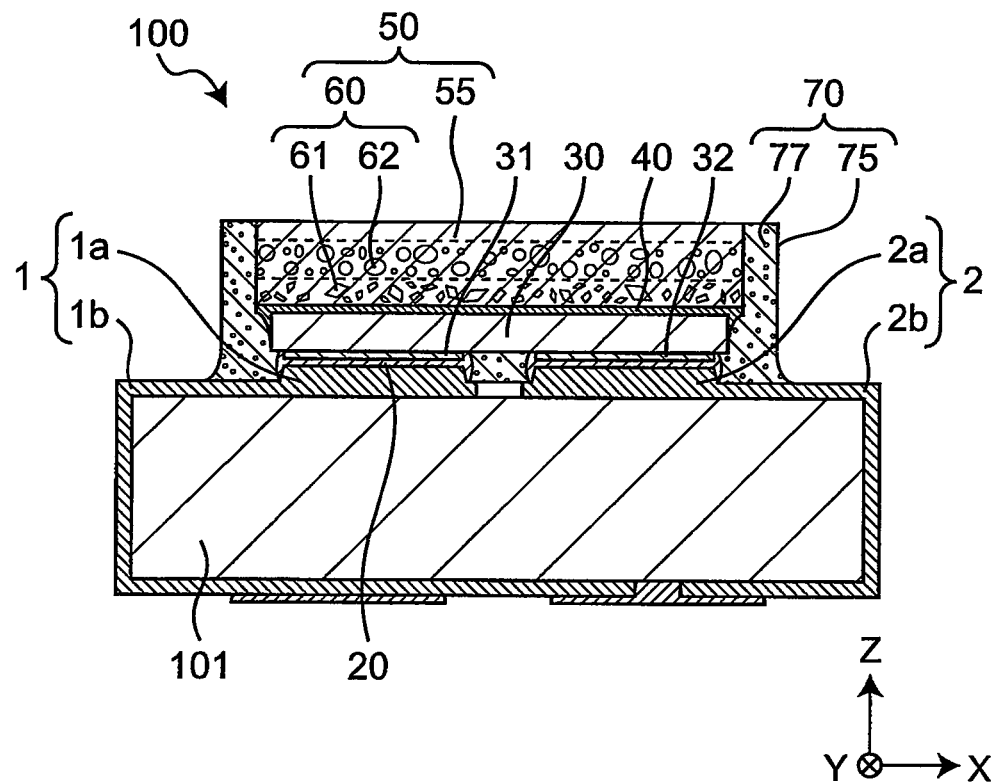
FIG. 2 is a sectional view of the light emitting device according to the first embodiment of the present disclosure.

Exemplary Structure of Light Emitting Device Fabricated Using Substrate 10 According to First Embodiment FIG. 2 is a sectional view showing the structure of the light emitting device 100 fabricated using the substrate 10 for a light emitting device according to the first embodiment. In FIG. 2, although the width direction is defined as the X direction, the thickness direction is defined as the Y direction, and the front-rear (i.e., depth) direction is defined as the Z direction, the X direction corresponds to the row direction of the substrate 10, the Y direction corresponds to the column direction of the substrate 10, and the Z direction corresponds to the thickness (height) direction of the substrate 10.

The light emitting device 100 shown in FIG. 2 includes a singulated substrate piece 101, a light emitting element 30, a light-transmissive member 50, and a covering member 70. The singulated substrate piece 101 is obtained as a result of the substrate 10 being cut. The singulated substrate piece 101 includes the first wiring 1 including the first projection part 1a on the first wiring part 1b, and the second wiring 2 including the second projection part 2a on the second wiring part 2b. The light emitting element 30 includes the p-side electrode 31 and the n-side electrode 32 on an identical surface side. The light emitting element 30 is flip-chip mounted so that the p-side electrode 31 is connected to the first projection part 1a via a conductive adhesive member 20, and the n-side electrode 32 is connected to the second projection part 2a via the conductive adhesive member 20. In the light emitting element 30, the surface opposite to the surface where the p-side electrode 31 and the n-side electrode 32 are formed is the light emitting surface. Further, the light emitting element 30 is a light emitting diode chip being longer in the X direction and shorter in the Y direction. The light-transmissive member 50 is a rectangular parallelepiped-shaped piece longer in the X direction and shorter in the Y direction. For example, the light-transmissive member 50 is greater in size than the light emitting element 30, and bonded to the light emitting surface of the light emitting element 30 via a light guide member 40. The light-transmissive member 50 contains a wavelength conversion substance 60 containing a first fluorescent material 61 and a second fluorescent material 62 in a base material 55. The covering member 70 is a reflective member containing white pigment 77 in a base material 75, and covers the lateral surfaces of the light emitting element 30 on the singulated substrate piece 101, the lateral surfaces of the light guide member 40, and the lateral surfaces of the light-transmissive member 50. The covering member 70 covers the lateral surfaces of each of the light emitting element 30, the light-transmissive member 50 and the like over their entire perimeter. Further, the upper surface of the light-transmissive member 50 and the upper surface of the covering member 70 are substantially flush with each other.

In the light emitting device 100 structured as described above, light laterally emitted from the light emitting element 30 and the light-transmissive member 50 is reflected by the covering member 70, and output upward (i.e., Z direction) and, hence, the light extraction efficiency in the upward (i.e., Z direction) direction improves. With the light emitting device 100 of such a structure, the covering member 70 needs to be formed to have a certain thickness in order to reduce the amount of light pass through the covering member 70 and increase the amount of light reflected by the covering member 70. Here, if the positional accuracy of the cutting position relative to the mounting position of the light emitting element 30 and the light-transmissive member 50 is poor, the covering member 70 must be formed to have a great thickness more than necessary taking into consideration of variance in the positional accuracy of the cutting position and, hence, downsizing is limited. On the other hand, when the light emitting device 100 is manufactured using the substrate 10 for a light emitting device according to the first embodiment, the positional accuracy of the cutting position relative to the mounting position of the light emitting element 30 improves. This improvement eliminates the necessity of forming the covering member 70 to have a great thickness more than necessary, and makes it possible to manufacture a light emitting device being small in size.

Method for Manufacturing Substrate for Light Emitting Device According to First Embodiment In the following, a description will be given of a method of manufacturing a substrate for a light emitting device according to the first embodiment.

(1) Providing Base Member

Figure 3A:
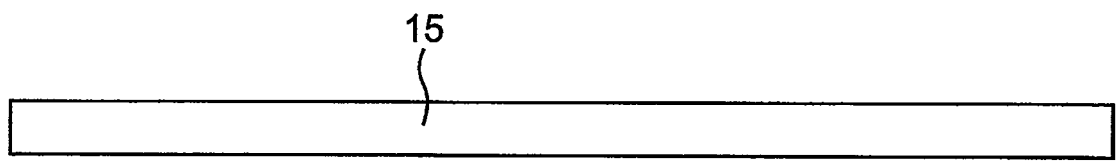
FIG. 3A is a sectional end view taken along line A-A in FIG. 1 of a base member provided in a method of manufacturing a substrate for a light emitting device according to the first embodiment of the present disclosure.

The base member 15 is provided with its shape set based on the number of pieces of light emitting devices formed on the substrate 10 and the final shape of each of the light emitting devices (shown in FIG. 3A). Specifically, the planar shape of the base member 15 is set based on the yields of the light emitting devices per base member 15 and the planar shape of individual light emitting devices, and the thickness of the base member is set based on the height of the light emitting devices. The base member 15 may be made of resin or fiber-reinforced resin, ceramic, glass or the like. Examples of the resin or fiber-reinforced resin include epoxy, glass epoxy, bismaleimide triazine (BT), polyimide or the like. Examples of the ceramic include aluminum oxide, aluminum nitride, zirconium oxide, zirconium nitride, titanium oxide, titanium nitride, or a mixture of the foregoing substances. The base member 15 may be flexible and, for example, may be formed using polyimide, polyethylene terephthalate, polyethylene naphthalate, liquid crystal polymer, cyclo olefin polymer or the like, each being flexible. Among these examples, use of the material having physical properties such as a linear expansion coefficient similar to the linear expansion coefficient of the light-emitting element is particularly preferable. With such a base member, there is less possibility of breakage of the light emitting element attributed to the difference in coefficient of thermal expansion from the base member. The coefficient of linear expansion of the base member 15 is preferably 15 ppm/° C. or less, more preferably 10 ppm/° C. or less. The lower limit value of the coefficient of linear expansion of the base member 15 is, for example, 1 ppm/° C. or more. Although the coefficient of linear expansion of the light emitting element differs depending on the type of the employed semiconductor material or the like, it is close to the coefficient of linear expansion of the material having the dominant volume in the light emitting element. Accordingly, when the light emitting element includes a sapphire substrate, normally the volume of the sapphire substrate is dominant. Therefore, the coefficient of linear expansion of the light emitting element is close to the coefficient of linear expansion of the sapphire substrate, and is about 7.7 ppm/° C., for example. When the light emitting element does not include a sapphire substrate and is structured by a semiconductor layer alone, the coefficient of linear expansion of the light emitting element is close to the coefficient of linear expansion of the employed semiconductor layer. The coefficient of linear expansion of a light emitting element made of a GaN-based semiconductor layer is about 5.5 ppm/° C., for example. The base member 15 having the coefficient of linear expansion of 10 ppm/° C. or less is less likely to be subject to deformation by heat. Thus, the positional accuracy of the first projection part, the second projection part and/or the alignment mark formed on the base member improves.

(2) Forming Groove

Subsequently, the through slits S penetrating through the base member 15 may be respectively formed between the region where the alignment marks are arranged in the vertical direction (i.e., Y direction) and the region of the first column where unit mounting regions are arranged, between the region of the first column where the unit mounting regions are arranged and the region of the second column where the unit mounting regions are arranged, between the region of the second column where the unit mounting regions are arranged and the region of the third column where the unit mounting regions are arranged, and outside the region of the third column where the unit mounting regions are arranged. Such formation of slits S can be performed, for example, by a router processing and/or a laser processing. For example, the through slits S are preferably respectively formed outside the outermost columns out of the columns of the unit mounting regions and between the columns of the unit mounting regions. Thus, by virtue of the through slits S being positioned on both sides of the unit mounting regions, cutting the base member is facilitated. In the case where the through slits are provided, preferably the first wiring part and the second wiring part are each formed to extend to the lower surface of the base member via the inner surfaces of each through slit. In this manner, the bonding strength of the first wiring part and the second wiring part to the base member improves. The opposite ends of the through slit S are spaced apart from the lateral surfaces of the base member. Thus, the plurality of unit mounting regions is supported by the outer peripheral part of the base member 15, after the through slits S are formed.

(3) Forming Metal Film Wiring

Figure 3B:
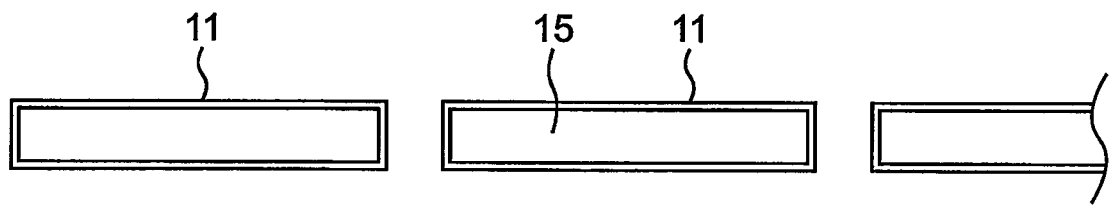
FIG. 3B is a sectional end view taken along line A-A in FIG. 1 after through slits are formed and a metal film wiring is formed in the method of manufacturing a substrate according to the first embodiment.

Subsequently, a metal film wiring 11 for forming the first wiring part and the second wiring part is formed on the surface of the base member 15 including one main surface (i.e., the upper surface) and other main surface (i.e., the lower surface) of the base member 15 and the lateral surface of the through slit S (shown in FIG. 3B). In the manufacturing method according to the first embodiment, as shown in FIG. 3B, the metal film wiring 11 is formed over the entire surface of the base member 15 including the regions where the alignment marks are formed. The metal film wiring 11 is formed to have a predetermined thickness by, for example, forming an electrolytic copper-plating layer on an electroless copper-plating layer. Although the thickness of the metal film wiring 11 is set as appropriate depending on the light emitting device to be manufactured, for example, the thickness may be in a range of 5 µm to 30 µm, preferably 10 µm to 25 µm, more preferably 15 µm to 20 µm. The material of the metal film wiring 11 may also be selected as appropriate depending on the light emitting device to be manufactured, but preferably the material is a metal material such as copper, nickel or the like.

(4) Performing First Photolithography 4-1. Forming First Resist Forming

Figure 3C:
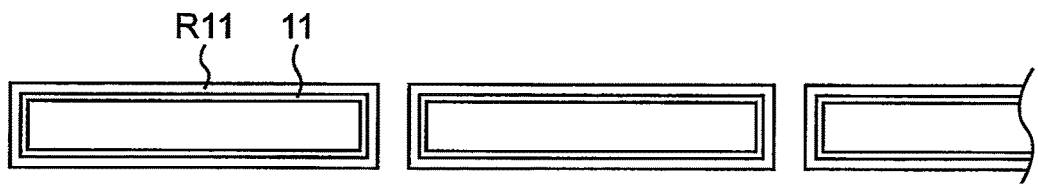
FIG. 3C is a sectional end view taken along line A-A in FIG. 1 after a first resist is formed on the metal film wiring in the method of manufacturing a substrate according to the first embodiment.

Firstly, resist R11 is applied over the entire metal film wiring 11 (shown in FIG. 3C). The resist R11 may be, for example, dry film resist which is cured by exposure to light. The dry film resist may be, for example, a carrier film, a photosensitive layer, or a cover film. The carrier film may be PET, the photosensitive layer may be acrylic resin, and the cover film may be polyethylene. The carrier film and the cover film may each have a thickness in a range of, for example, 20 µm or more to 50 µm or less.

4-2. First Exposing to Light

Subsequently, for example, based on the wiring pattern data for the first wiring part 1b and the second wiring part 2b, the resist R11 is directly irradiated with light, so that the portions corresponding to the first wiring part 1b and the second wiring part 2b (i.e., the portions positioned on the first wiring part 1b and the second wiring part 2b) are cured. Although the example using a direct imaging device for directly irradiating the resist R11 with light based on the wiring pattern data is described here, light exposure may be performed via a mask in which patterns corresponding to the first wiring part 1b and the second wiring part 2b are formed.

4-3. First Developing

Figure 3D:
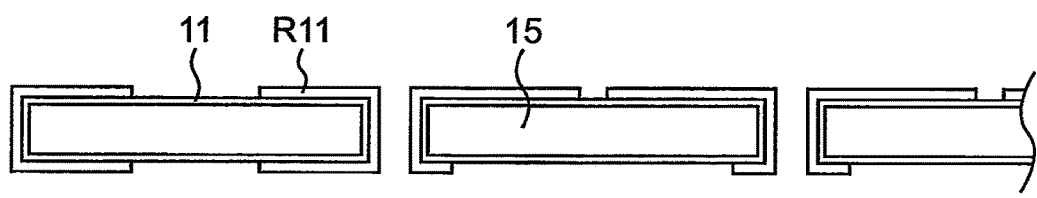
FIG. 3D is a sectional end view taken along line A-A in FIG. 1 after the first resist is exposed to light and developed in the method of manufacturing a substrate according to the first embodiment.

Subsequently, the resist R11 that has not been cured is removed. For example, a developing solution such as trichloroethane, an NaOH aqueous solution or the like may be used. By this development, the resist R11 formed to have the patterns corresponding to the first wiring part 1b and the second wiring part 2b is formed (shown in FIG. 3D).

4-4. Metal Film Removing Operation

Figure 3E:
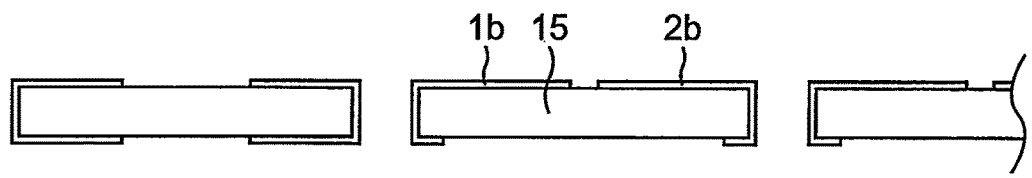
FIG. 3E is a sectional end view taken along line A-A in FIG. 1 after the metal film wiring is etched using the developed first resist as a mask and the first resist is removed in the method of manufacturing a substrate according to the first embodiment.

Subsequently, by etching the metal film wiring 11 using the patterned resist R11, the first wiring part 1b and the second wiring part 2b are formed (shown in FIG. 3E). Preferably, the first wiring part and the second wiring part are formed so that the unit mounting regions are arranged in one direction. This manner contributes toward increasing the yields of the singulated substrate pieces per substrate. Further, preferably, the first wiring part and the second wiring part are formed so that a plurality of columns in each of which the unit mounting regions are arranged in one direction is juxtaposed to one another in the direction perpendicular to the one direction. This manner further contributes toward increasing the yields of the singulated substrate pieces per substrate. In the present disclosure, perpendicular refers to an angle of 90±5°.

The portion where each alignment mark 3 is formed is preferably an opening formed by part of the metal film wiring 11 being removed, whereas the base member 15 is exposed. As a result, a portion where the base member 15 is exposed serves as the alignment mark 3, therefore, the device is easily recognized in steps of Processing Light-transmissive Member or Singulation described later, based on the difference in appearance between the exposed portion of the base member and a metal frame 3a surrounding the exposed portion.

By the above-described first photolithography operation, the first wiring part 1b and the second wiring part 2b are formed. Although the above-described example uses a so-called negative type resist in which an exposed portion is remained after the exposure to light and the removal, it is also possible to use a positive type resist in which an exposed portion is removed after the exposure and the removal.

(5) Metal Film Projection Forming Operation

Figure 3F:
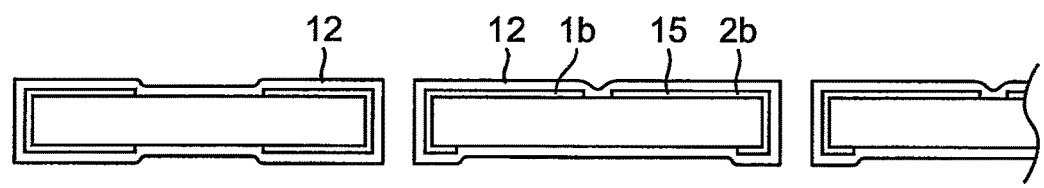
FIG. 3F is a sectional end view taken along line A-A in FIG. 1 after a metal film projection is formed on the base member including a first wiring part and a second wiring part in the method of manufacturing a substrate according to the first embodiment.

Subsequently, a metal film projection 12 for forming the first projection part, the second projection part, and the metal frame surrounding the alignment mark is formed on or above the surface of the base member 15 including one main surface and other main surface of the base member 15 and the lateral surfaces of the through slits (shown in FIG. 3F). As shown in FIG. 3F, as to the portions where the first wiring part 1b and the second wiring part 2b are not formed, the metal film for projection 12 is directly formed at the surface of the base member 15. As to the portions where the first wiring part 1b and the second wiring part 2b are formed, the metal film projection 12 is formed above the surface of the base member 15 via the first wiring part 1b and the second wiring part 2b. In the present manufacturing method according to the first embodiment, the metal film projection 12 is formed over the entire surface of the base member 15 including the region where the alignment marks are formed.

A metal film for metal frame surrounding each alignment mark may however be formed in an operation other step for forming the metal film projection. In the case where the metal frame-purpose metal film is formed in other step for forming the metal film, the metal film projection is referred to as the first metal film, and the metal film for metal frame is referred to as the second metal film. In other words, the metal film projection 12 in the metal film forming operation according to the first embodiment corresponds to the first metal film and the second metal film being formed in an identical metal film forming operation. Further, the metal film projection is formed to have a predetermined thickness by, for example, performing electrolytic copper-plating on an electroless copper-plating layer. The metal film projection 12 is formed to have a thickness in a range of, for example, 8 μm to 50 μm, preferably 10 μm to 40 μm, more preferably 15 μm to 30 μm. The material of the metal film projection 12 may be selected as appropriate depending on the manufactured light emitting device, the material is however preferably a metal material such as copper, nickel or the like.

(6) Second Photolithography

6-1. Forming Second Resist Forming

Figure 3G:
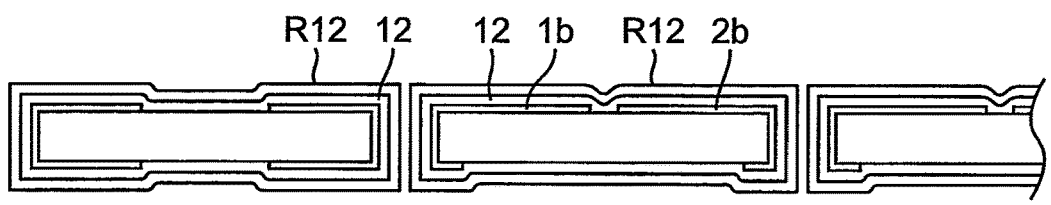
FIG. 3G is a sectional end view taken along line A-A in FIG. 1 after a second resist is formed on the metal film projection in the method of manufacturing a substrate according to the first embodiment.

Resist R12 is applied over the entire metal film projection 12 (shown in FIG. 3G). The resist R12 may be, for example, dry film resist which is cured after exposure to light. The dry film resist may be a member similar to those described above. The resist for forming the first projection part and the second projection part is used for a projection part forming-purpose resist, and the resist for forming the alignment mark is used for an alignment mark forming-purpose resist, so that the resist R12 includes the projection part forming-purpose resist and the resist for forming alignment mark.

6-2. Second Exposing to Light

Figure 3H:
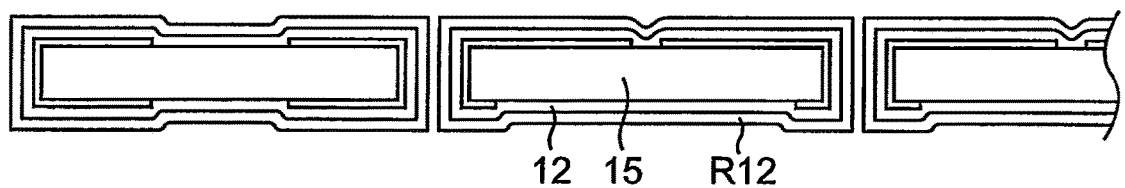
FIG. 3H is a sectional end view taken along line A-A in FIG. 1 after the second resist is exposed to light in the method of manufacturing a substrate according to the first embodiment.

Subsequently, for example, based on the pattern data for the first projection part, the second projection part, and the metal frame surrounding the alignment mark, the resist R12 is directly irradiated with light, so that the portions corresponding to the first projection part, the second projection part, and the metal frame are cured (shown in FIG. 3H). This direct imaging of directly irradiating the resist R12 with light is performed as a series of continuous light irradiation, for example, without resetting the irradiation position between irradiation for the first projection part pattern and irradiation for the second projection part pattern, and between irradiation for the first projection part and/or second projection part pattern and irradiation for the metal frame 3a pattern. In other words, the resist for forming projection part and the resist for forming alignment mark are exposed in an identical step of exposing to light. Although the manufacturing method according to the first embodiment exemplifies direct imaging, exposure may be performed via a photomask in which patterns respectively corresponding to the first projection part, the second projection part, and the metal frame are collectively formed.

6-3. Second Developing

Figure 3I:
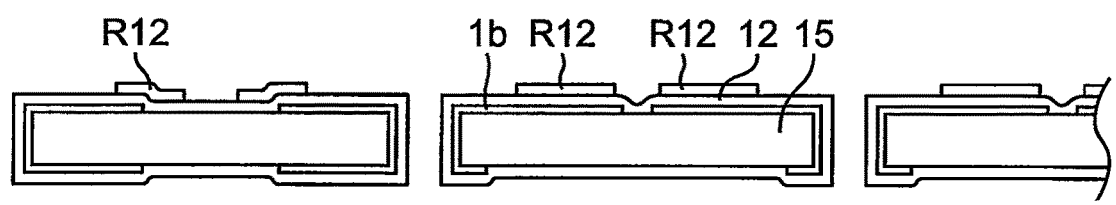
FIG. 3I is a sectional end view taken along line A-A in FIG. 1 after the second resist exposed to light is developed in the method of manufacturing a substrate according to the first embodiment.

Subsequently, the resist R12 that has not been cured is removed (shown in FIG. 3I). For example, the developing solution may be a solution similar to those noted above. By this development, the resist R12 formed to have the patterns corresponding to the first projection part 1*a*, the second projection part 2*a*, and the metal frame 3*a* is formed.

6-4. Removing Metal Film Projection

Figure 3J:
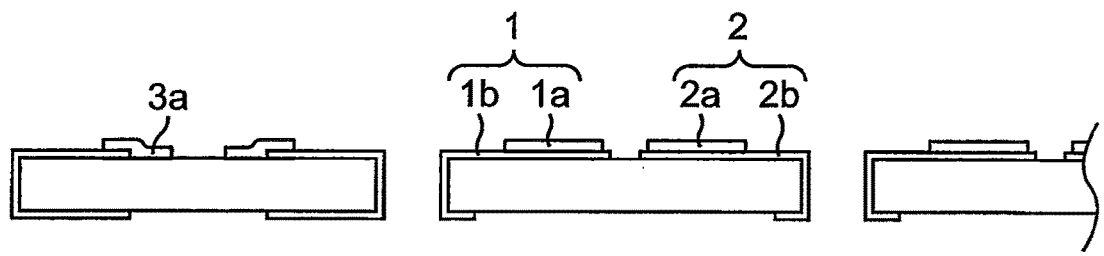
FIG. 3J is a sectional end view taken along line A-A in FIG. 1 after the metal film projection is etched using the developed second resist as a mask and the second resist is removed in the method of manufacturing a substrate according to the first embodiment.

Subsequently, by etching the metal film projection 12 using the patterned resist R12, the first projection part 1*a*, the second projection part 2*a*, and the metal frame 3*a* are formed (shown in FIG. 3J). In the present manufacturing method according to the first embodiment, the first projection part 1*a*, the second projection part 2*a*, and the metal frame 3*a* are formed using the resist R12. Alternatively, the resist for forming the first projection part and the second projection part, and the resist for forming the alignment mark to form the metal frame 3*a* may however be different from each other. The resist for forming projection part and the resist for forming alignment mark may be exposed in an identical step of exposing to light.

The first projection part 1*a*, the second projection part 2*a*, and the metal frame 3*a* are formed by the above-described second photolithography operation. In the second exposing operation in the second photolithography operation, irradiation corresponding to the pattern of the first projection part 1*a*, irradiation corresponding to the pattern of the second projection part 2*a*, and irradiation corresponding to the pattern of the metal frame 3*a* are performed by a series of continuous light irradiation. Therefore, each alignment mark can be formed with high positional accuracy relative to the first projection part 1*a* and the second projection part 2*a*. Further, in the manufacturing method according to the first embodiment, in the case where exposure to light is performed via a photomask in which patterns respectively corresponding to the first projection part 1*a*, the second projection part 2*a*, and the metal frame 3*a* are collectively formed also, similarly, each alignment mark is formed with high positional accuracy relative to the first projection part 1*a* and the second projection part 2*a*. In the case where the unit mounting regions are arranged in one direction, preferably the alignment marks are formed in one direction so as to each correspond to corresponding ones of the unit mounting regions. This manner makes it easier to form the alignment marks in a narrow space.

A description will be given below for a method of manufacturing the light emitting device 100 according to the first embodiment with reference to FIGS. 4A to 4E. FIGS. 4A to 4E are each an end view in the column direction of the substrate 10 on which the unit mounting regions are arranged, each showing the first wirings 1.

Mounting Light Emitting Element

Figure 4A:
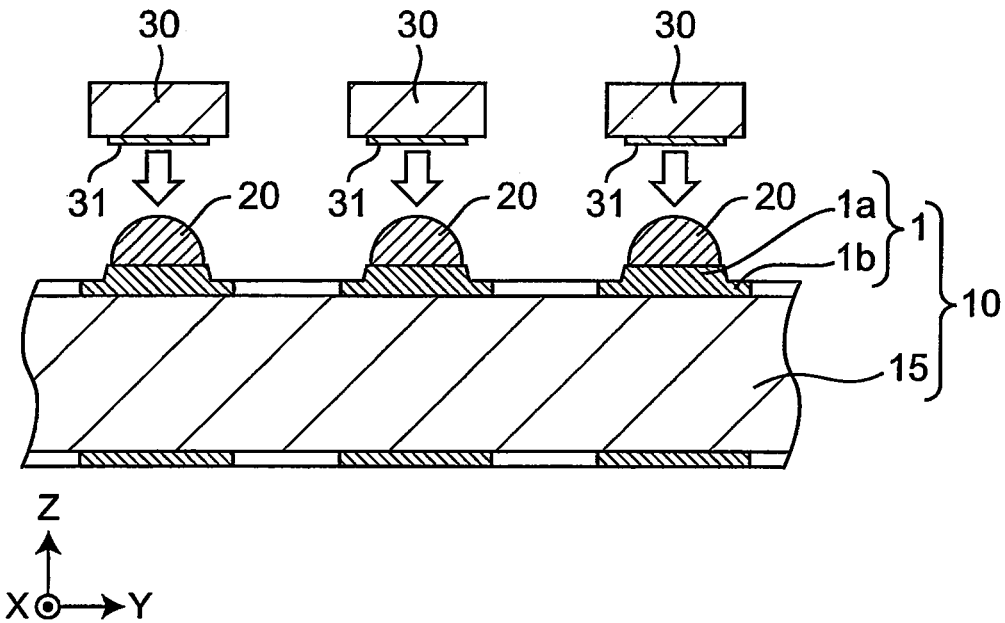
FIG. 4A is a sectional end view taken along line B-B in FIG. 1 showing a manner of mounting light emitting elements on the substrate in a method of manufacturing a light emitting device according to the first embodiment of the present disclosure.

In the step of mounting light emitting element, as shown in FIG. 4A, each light emitting element 30 is flip-chip mounted on the substrate 10. Specifically, the paste-like conductive adhesive member 20 is applied onto the first projection part 1*a* and the second projection part 2*a*. The light emitting element 30 is mounted such that the p-side electrode 31 and the n-side electrode 32 of the light emitting element 30 respectively face the first projection part 1*a* and the second projection part 2*a*. The conductive adhesive member 20 is heated with a reflow oven or the like thereby molten. Thereafter, the conductive adhesive member 20 is cooled so as to be cured. At this time, the light emitting element 30 is mounted with high accuracy relative to the first projection part 1*a* and the second projection part 2*a* by the self-alignment effect brought about by the first projection part 1*a* and the second projection part 2*a*. Here, the conductive adhesive member 20 is, for example, solder.

Bonding Light-Transmissive Member

Figure 4B:
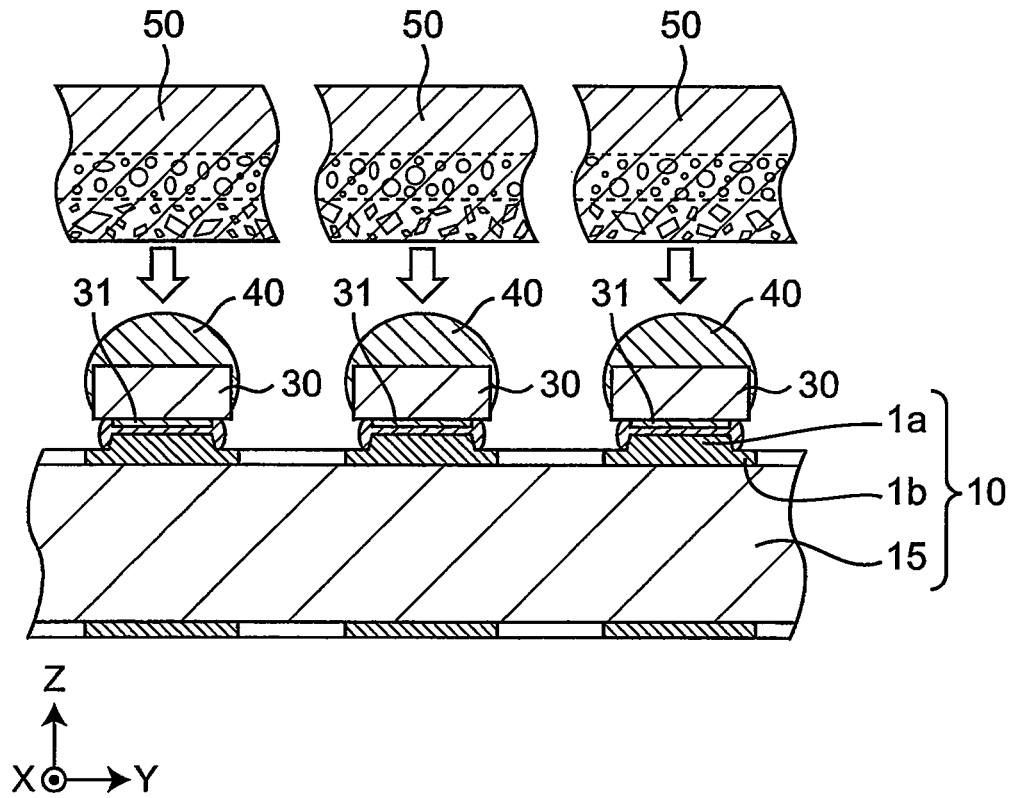
FIG. 4B is a sectional end view taken along line B-B in FIG. 1 showing a manner of disposing light-transmissive members on the mounted light emitting elements in the method of manufacturing a light emitting device according to the first embodiment.

In the step of bonding light-transmissive member, as shown in FIG. 4B, each light-transmissive member 50 is bonded to each light emitting element 30. Specifically, the light guide member 40 in the liquid state is applied onto the light emitting element 30, and the light-transmissive member 50 is mounted thereon. Then, the light guide member 40 is caused by a heating process. In the following, "the liquid state" as used in the present disclosure includes the sol state and the slurry state.

Processing of Light-Transmissive Member

Figure 4C:
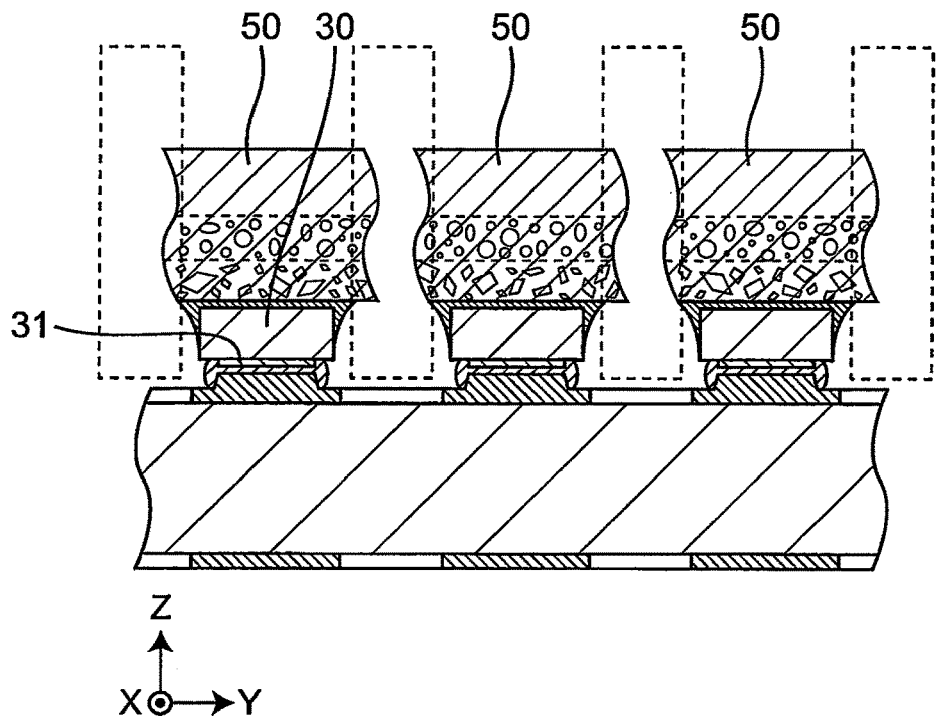
FIG. 4C is a sectional end view taken along line B-B in FIG. 1 showing a manner of shaping the disposed light-transmissive members in the method of manufacturing a light emitting device according to the first embodiment.

In the step of processing light-transmissive member, as shown in FIG. 4C, the lateral surfaces of the light-transmissive member 50 is cut to make the light-transmissive member 50 a predetermined dimension. Specifically, for example, the lateral surface of one of adjacent light-transmissive members 50 and the lateral surface of the other one of the adjacent light-transmissive members 50 are cut simultaneously, for example, by rotating a rotary blade having a predetermined thickness to run in the X direction and the Y direction while rotating. Thus, the light-transmissive member 50 for each light emitting device is processed to have a predetermined shape. In rotating the rotary blade, the rotary blade is positioned with reference to the alignment marks. Here, in the substrate according to the first embodiment, each alignment mark is formed with high positional accuracy relative to the first projection part and the second projection part, and the light emitting element is mounted at high positional precision relative to the first projection part and the second projection part by virtue of the self-alignment effect. Thus, the rotating the rotary blade can be performed having the rotary blade precisely aligned with the light emitting element. Accordingly, the light emitting element on which the light-transmissive member 50 is disposed can be processed with high accuracy.

Forming of Covering Member

Figure 4D:
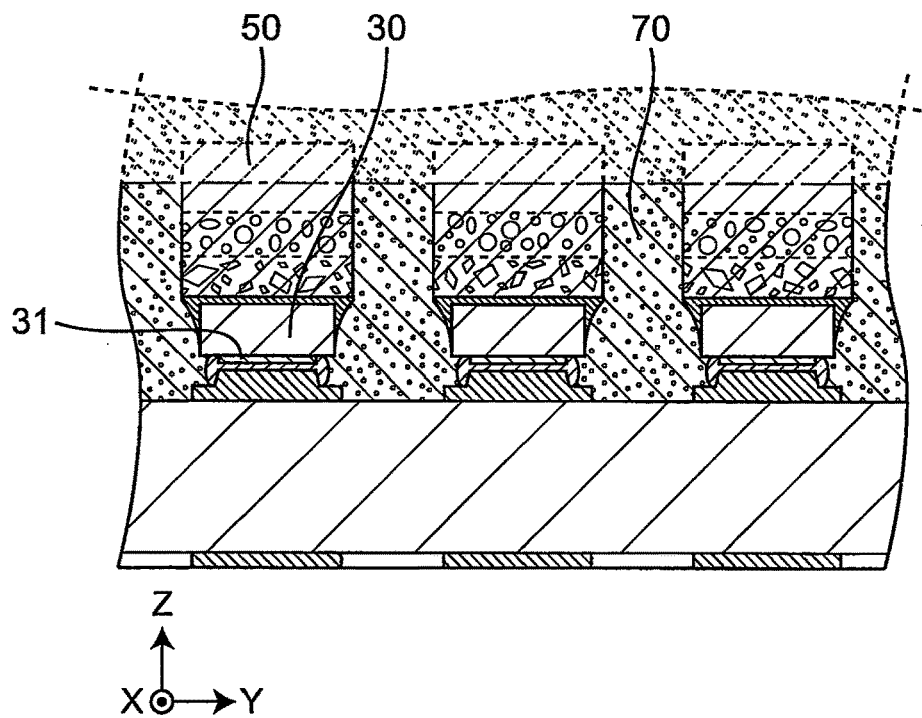
FIG. 4D is a sectional end view taken along line B-B in FIG. 1 showing a manner of forming a covering member covering the mounted light emitting elements and the disposed light-transmissive members in method of manufacturing a light emitting device according to the first embodiment.

In the step of forming covering member, as shown in FIG. 4D, for example, the space around the light emitting element 30 and the light-transmissive member 50 on the substrate is filled with the covering member 70 in the liquid state, and the covering member 70 is heated to be cured. Thus, the light-reflective covering member 70 covering the light-transmissive member 50 and the light emitting element 30 on the substrate is formed on the substrate. Here, for example, the covering member 70 is formed and cured such that the light-transmissive member 50 is completely embedded in the covering member 70, followed by exposing the upper surface of the light-transmissive member 50 from the covering member 70 by grinding or blasting. Here, the covering member 70 is preferably formed so as to avoid the alignment mark 3 from being covered. In this manner, the covering member is formed around the light emitting elements 30 while embedding the light emitting elements 30, and avoiding the alignment marks 3 from being covered.

Singulation

Figure 4E:
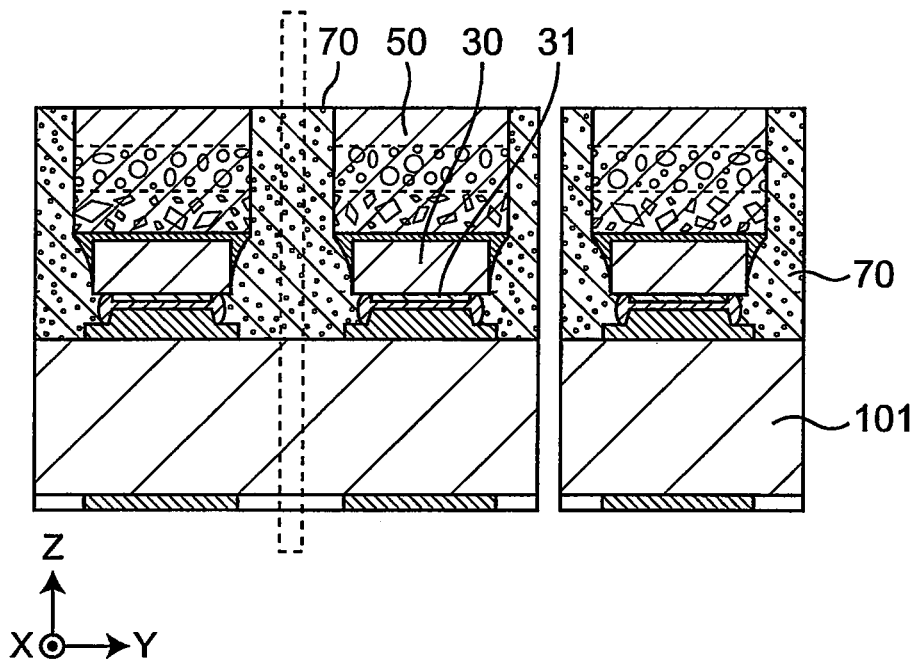
FIG. 4E is a sectional end view taken along line B-B in FIG. 1 showing a manner of cutting the covering member and the substrate into individual light emitting devices in the method of manufacturing a light emitting device according to the first embodiment.

In the step of singulation, as shown in FIG. 4E, the substrate and the covering member 70 are cut with a cutting blade, so that covering member 70 covering the lateral surfaces of the light-transmissive member 50 and the lateral surfaces of the light emitting element 30 by a predetermined width is formed. In cutting the substrate and the covering member 70, the cutting position is set by positioning the cutting blade with reference to the alignment marks. Here, in the substrate 10 according to the first embodiment, each alignment mark is formed with high positional accuracy relative to the first projection part 1a and the second projection part 2a, and each light emitting element is mounted with high positional accuracy by virtue of the self-alignment effect relative to the first projection part and the second projection part. Hence, the substrate 10 and the covering member 70 can be cut to obtain individual light emitting devices with high accuracy relative to the light emitting elements 30 and/or the light-transmissive members 50. In the case where the unit mounting regions are arranged in one direction, the substrate 10 and the covering member 70 are cut in the direction perpendicular to one direction, so that the substrate 10 and the covering member 70 are separated into individual light emitting devices each including at least one light emitting element.

As has been described above, in the method of manufacturing the light emitting device 100 according to the first embodiment, the light emitting device 100 is manufactured using the substrate 10 in which each alignment marks 3 are formed with high positional accuracy relative to the first projection parts 1a and the second projection parts 2a. Therefore, the positional accuracy of the cutting position relative to the mounting position of the light emitting element 30 improves. This improvement eliminates the necessity of forming the covering member 70 to have a great thickness more than necessary, and makes it possible to manufacture a light emitting device being small in size.

Figure 4F:
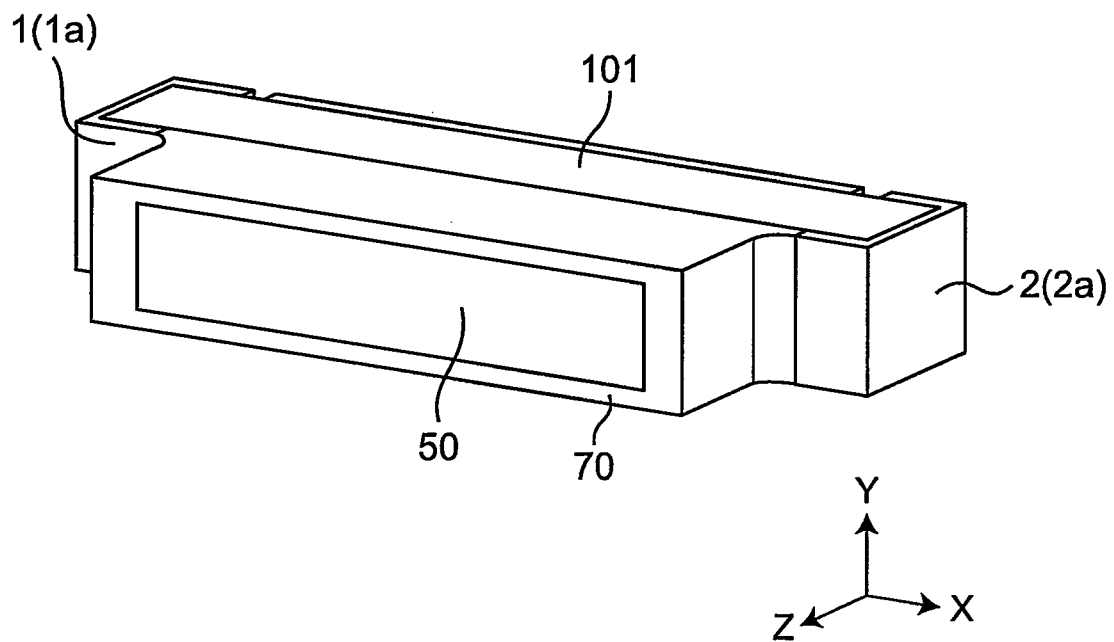
FIG. 4F is a perspective view of the light emitting device manufactured according to the method of manufacturing a light emitting device according to the first embodiment.

Further, each alignment mark 3 is formed with high positional accuracy relative to the first projection part 1a and the second projection part 2a on which the light emitting element 30 is to be mounted, and the light-transmissive member 50 disposed on the light emitting element 30 is formed relative to the alignment mark 3. This manner improves the positional accuracy between the light-transmissive member 50 after the step of processing and the cutting position. As shown in FIG. 4F for example, this improvement eliminates the necessity of forming the covering member 70 covering the lateral surfaces in the longitudinal direction of the light-transmissive member 50 to have a great thickness more than necessary, and makes it possible to manufacture a light emitting device being small in size.

Figure 5:
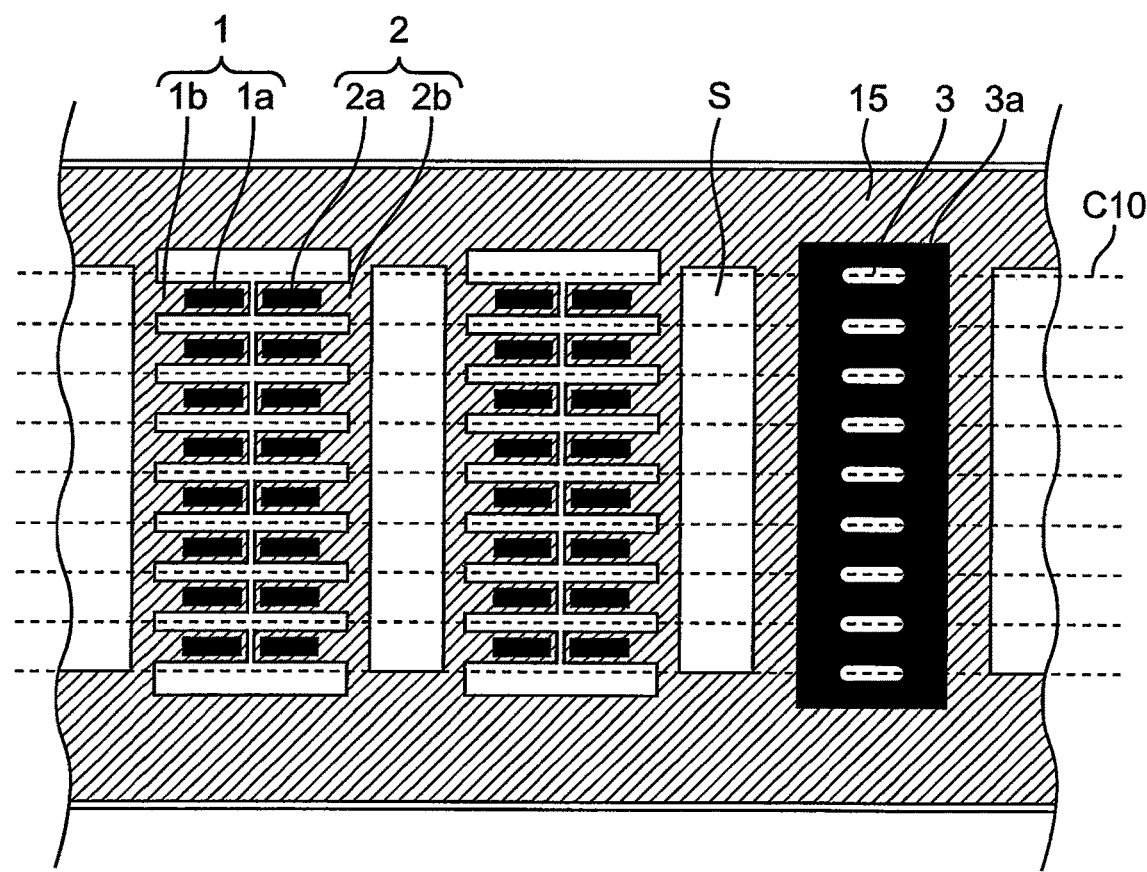
FIG. 5 is a plan view showing a variation of the substrate according to the first embodiment.

In the substrate for the light emitting device 100 and the method of manufacturing the light emitting device 100 according to the first embodiment, each alignment mark 3 is disposed between the cutting lines C10. However, in the substrate for the light emitting device 100 and the method of manufacturing the light emitting device 100 according to the first embodiment, each alignment mark 3 may be disposed on the cutting line C10. Specifically, as shown in FIG. 5, for example, each alignment mark 3 may be disposed such that the center line of the alignment mark 3 in the longitudinal direction and the cutting line C10 overlap with each other in a top view. This structure makes it possible to highly accuracy set the cutting position with reference to each alignment mark 3.

In the substrate for the light emitting device 100 and the method of manufacturing the light emitting device 100 according to the first embodiment, although the alignment mark 3 is provided for each row of the first wiring and the second wiring, for example, one alignment mark 3 may be provided for a plurality of rows. This structure can simplify the exposure pattern. In this structure, the device is positioned recognizing one alignment mark 3, followed by processing the plurality of rows. Thus, it becomes possible to reduce the number of times of recognizing the alignment mark 3 and positioning the device for a plurality of rows of the substrate, and to improve mass productivity.

In the substrate for the light emitting device 100 and the method of manufacturing the light emitting device 100 according to the first embodiment, although each alignment mark 3 is a recess surrounded by the metal frame, each alignment mark 3 may be a projection formed by the metal film for projection or the second metal film. Each alignment mark 3 is preferably a recess in view of alleviating delamination or loss of adhesion of the alignment mark 3.

Although the light emitting device 100 according to the first embodiment includes one light emitting element 30, a plurality of light emitting elements 30 may be mounted in the light emitting device. With this structure, the amount of light extracted from one light emitting device can be increased. In this case, the substrate preferably includes the first wiring, the second wiring, the first projection parts, and the second projection parts respectively corresponding to the plurality of light emitting elements.

Figure 6:
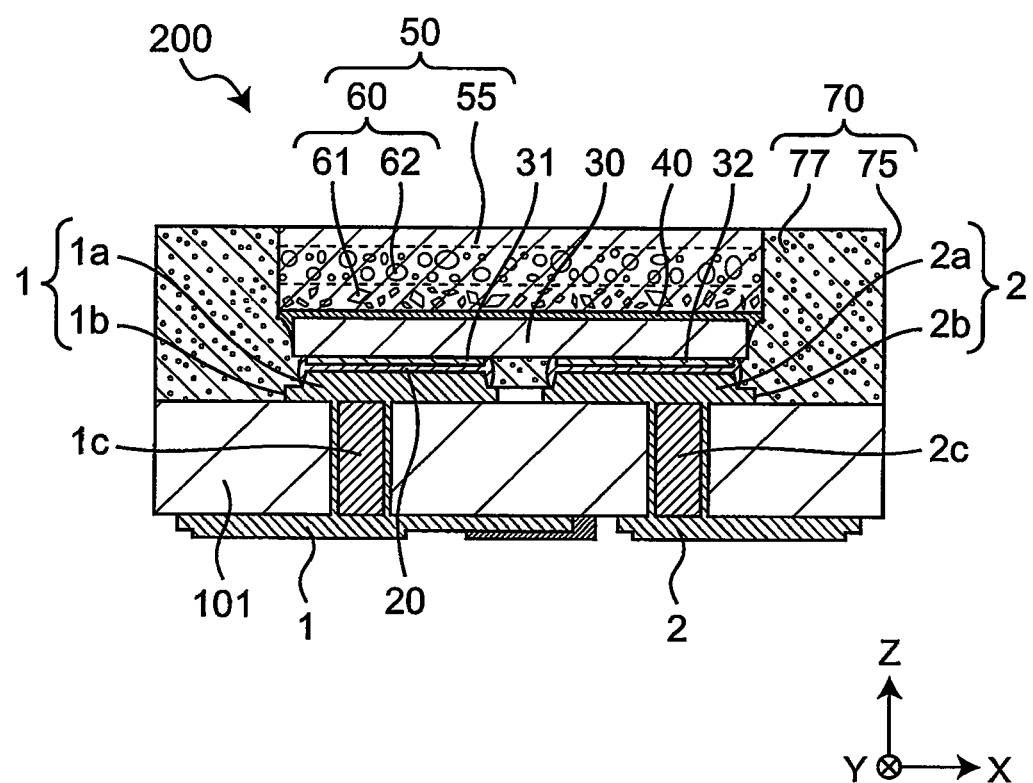
FIG. 6 is a sectional view showing a variation of the light emitting device according to the first embodiment.

As shown in FIG. 2, the light emitting device 100 according to the first embodiment has a structure in which the lateral surfaces of the covering member and the lateral surfaces of the singulated substrate piece are located on planes different from each other in the width direction of the light-transmissive member, so that a stair-step is formed at the lateral surface of the light emitting device between the lateral surface of the covering member and the lateral surface of the singulated substrate piece. However, as in Variation shown in FIG. 6, the lateral surfaces of the covering member and the lateral surfaces of the singulated substrate piece may be positioned at a substantially identical plane in the width direction (i.e., the X direction) of the light-transmissive member, so that no stair-step is formed at the lateral surface of the light emitting device. Further, in a light emitting device 200 of Variation shown in FIG. 6, for example, instead of the first wiring part and the second wiring part at the lateral surfaces of the singulated substrate piece 101, through holes are formed at the singulated substrate piece 101. Through wirings respectively formed on the through holes connect the first wiring 1 and the second wiring 2 formed on/above the upper surface of the singulated substrate piece 101 to the first wiring 1 (i.e., the first external connection electrode) and the second wiring 2 (i.e., the second external connection electrode) formed on/above the lower surface of the singulated substrate piece 101. In this manner, positioning the lateral surfaces of the covering member and the lateral surfaces of the singulated substrate piece substantially at an identical plane in the width direction (i.e., the X direction) of the light-transmissive member can achieve downsizing of the light emitting device. In FIG. 6, members expressed by the reference numerals 1c and 2c are resin with which the through holes are filled. In order to position the lateral surfaces of the covering member and the lateral surfaces of the singulated substrate piece substantially at an identical plane as in the light emitting device 200 of Variation shown in FIG. 6, for example, the lateral surfaces of the covering member and the lateral surfaces of the singulated substrate piece should be continuously cut with the cutting blade in the step of singulation. In the present disclosure, "positioning substantially at an identical plane" may include a height difference of tolerance of about ±10 µm.

What is claimed is:

1. A method of manufacturing a substrate for a light emitting device, the method comprising:
    forming a metal film wiring on an upper surface of a base member;
    etching the metal film wiring using a patterned resist to form a plurality of first wiring parts, a plurality of second wiring parts and an opening where a first portion of the base member is exposed on the upper surface of the base member;
    forming projection parts including a first projection part on each of the first wiring parts and a second projection part on each of the second wiring parts by forming a first metal film on a region including at least part of the first wiring parts and at least part of the second wiring parts and etching the first metal film using a resist having a predetermined shape for forming the projection parts; and
    forming at least one alignment mark by forming a second metal film on the first portion of the base member and on the metal film wiring and etching the second metal film using a resist for forming the at least one alignment mark where a second portion of the first portion of the base member is exposed inside of the opening,
    wherein the resist for forming the projection parts and the resist for forming the at least one alignment mark are exposed to light in an identical step of exposing to light.

2. The method of manufacturing a substrate according to claim 1, wherein the first metal film and the second metal film are formed in an identical step of forming a metal film.

3. The method of manufacturing a substrate according to claim 1, wherein the alignment mark is formed as an opening where the base member is exposed.

4. The method of manufacturing a substrate according to claim 1, wherein the first wiring parts and the second wiring parts are formed such that unit mounting regions each including at least one of the first wiring parts and at least one of the second wiring parts are arranged in a first direction.

5. The method of manufacturing a substrate according to claim 4, further comprising forming one or more additional alignment marks in the first direction so as to respectively correspond to the unit mounting regions arranged in the first direction.

6. The method of manufacturing a substrate according to claim 4, wherein the first wiring parts and the second wiring parts are formed such that a plurality of columns in each of which the unit mounting regions are arranged in the first direction is juxtaposed to each other in a second direction perpendicular to the first direction.

7. The method of manufacturing a substrate according to claim 6, further comprising forming through slits on outer sides of outermost ones of the columns and between the columns, respectively.

8. The method of manufacturing a substrate according to claim 7, wherein the first wiring parts and the second wiring parts are respectively formed to extend to a lower surface of the base member via inner sides of the through slits.

9. A method of manufacturing a light emitting device, comprising:
    manufacturing a substrate according to the method of claim 4; and
    mounting light emitting elements to bond the light emitting elements each including a p-side electrode and an n-side electrode on an identical surface side in each of the unit mounting regions,
    wherein the p-side electrode is bonded to an upper surface of corresponding one of the first projection parts, and the n-side electrode is bonded to an upper surface of corresponding one of the second projection parts.

10. The method of manufacturing a light emitting device according to claim 9, wherein the p-side electrode and the n-side electrode of the light emitting elements are respectively bonded to the first projection part and the second projection part with solder.

11. The method of manufacturing a light emitting device according to claim 9, further comprising:
    bonding one of a plurality of light-transmissive members onto each of the light emitting elements; and
    processing the light-transmissive members such that each of the light transmissive members has a predetermined shape by positioning a cutting blade based on one or more position of the at least one alignment mark and processing the light transmissive members.

12. The method of manufacturing a light emitting device according to claim 10, further comprising forming a covering member around the light emitting elements so as to embed the light emitting elements and to not cover the at least one alignment mark.

13. The method of manufacturing a light emitting device according to claim 9, further comprising positioning a cutting blade based on one or more positions of the at least one alignment mark, and cutting the substrate such that the substrate is separated into individual light emitting devices each including at least one of the light emitting elements.

14. The method of manufacturing a light emitting device according to claim 13, wherein the substrate is cut in a second direction perpendicular to the first direction.

* * * * *